United States Patent
Kim et al.

(10) Patent No.: US 10,421,887 B2
(45) Date of Patent: Sep. 24, 2019

(54) ADHESIVE COMPOSITION

(71) Applicant: LG CHEM, LTD., Seoul (KR)

(72) Inventors: So Young Kim, Daejeon (KR); Seung Min Lee, Daejeon (KR); Jung Sup Shim, Daejeon (KR); Se Woo Yang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 15/560,025

(22) PCT Filed: Mar. 24, 2016

(86) PCT No.: PCT/KR2016/003007
§ 371 (c)(1),
(2) Date: Sep. 20, 2017

(87) PCT Pub. No.: WO2016/153296
PCT Pub. Date: Sep. 29, 2016

(65) Prior Publication Data
US 2018/0072925 A1    Mar. 15, 2018

(30) Foreign Application Priority Data
Mar. 24, 2015  (KR) .................. 10-2015-0040742

(51) Int. Cl.
| | |
|---|---|
| *H01L 29/40* | (2006.01) |
| *H01L 21/00* | (2006.01) |
| *C09J 123/22* | (2006.01) |
| *C08L 33/04* | (2006.01) |
| *C08L 63/00* | (2006.01) |
| *C08L 75/04* | (2006.01) |
| *C08L 101/02* | (2006.01) |
| *B33Y 70/00* | (2015.01) |
| *H01L 51/00* | (2006.01) |

(52) U.S. Cl.
CPC ............. *C09J 123/22* (2013.01); *B33Y 70/00* (2014.12); *C08L 33/04* (2013.01); *C08L 63/00* (2013.01); *C08L 75/04* (2013.01); *C08L 101/02* (2013.01); *H01L 51/0034* (2013.01)

(58) Field of Classification Search
CPC .................................................. H01L 51/0034
USPC .................................. 438/118; 257/753, 783
See application file for complete search history.

(56) References Cited

U.S. PATENT DOCUMENTS

| | | | |
|---|---|---|---|
| 8,232,350 B2* | 7/2012 | Fujita ...................... | C08L 23/22 |
| | | | 525/191 |
| 9,587,150 B2* | 3/2017 | Lee .......................... | C08L 51/06 |
| | (Continued) | | |

FOREIGN PATENT DOCUMENTS

| | | |
|---|---|---|
| CN | 103998554 A | 8/2014 |
| JP | 2013-216782 A | 10/2013 |
| | (Continued) | |

*Primary Examiner* — Calvin Lee
(74) *Attorney, Agent, or Firm* — Dentons US LLP

(57) ABSTRACT

Provided are an adhesive composition and an organic electronic device (OED) including the same, and more particularly, an adhesive composition, which may form a structure effectively blocking moisture or oxygen flowing into an OED from the outside, thereby ensuring the lifespan of the OED, realize a top-emission OED, and exhibit excellent adhesive durability and reliability, and excellent reliability at high temperature and high humidity, and an OED including the same.

12 Claims, 1 Drawing Sheet

(56) References Cited

U.S. PATENT DOCUMENTS

| | | |
|---|---|---|
| 2014/0315016 A1 | 10/2014 | Dollase et al. |
| 2014/0322526 A1 | 10/2014 | Dollase et al. |
| 2016/0133872 A1 | 5/2016 | Yoo et al. |

FOREIGN PATENT DOCUMENTS

| | | |
|---|---|---|
| KR | 10-2008-0030649 A | 4/2008 |
| KR | 10-20080088606 A | 10/2008 |
| KR | 10-2011-0014692 A | 2/2011 |
| KR | 10-2012-0091349 A | 8/2012 |
| KR | 10-2013-0055541 A | 5/2013 |
| KR | 10-2015-0010667 A | 1/2015 |
| TW | 201002796 A1 | 1/2010 |
| WO | 2009/148722 A2 | 12/2009 |
| WO | 2014189293 A1 | 11/2014 |

\* cited by examiner

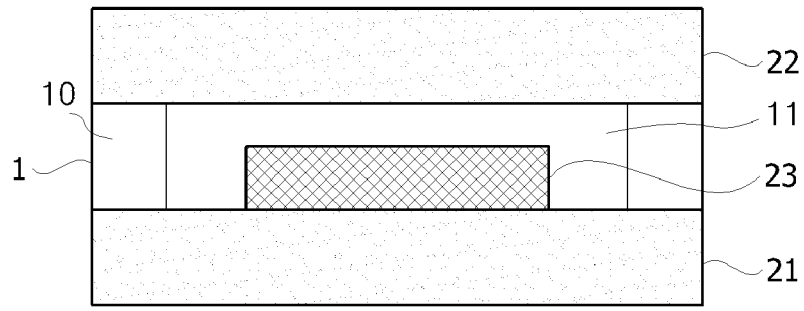

ADHESIVE COMPOSITION

CROSS-REFERENCE TO RELATED APPLICATION

This application is a National Stage Entry of International Application No. PCT/KR2016/003007, filed Mar. 24, 2016, and claims the benefit of Korean Patent Application No. 10-2015-0040742, filed on Mar. 24, 2015 with the Korean Intellectual Property Office, the disclosure of which is herein incorporated by reference in its entirety.

BACKGROUND

1. Field of the Invention

The present application relates to an adhesive composition, an organic electronic device (OED) including the same, and a method of manufacturing the OED.

2. Discussion of Related Art

An OED is a device including an organic material layer in which electric charges are exchanged using holes and electrons, and the OED may be, for example, a photovoltaic device, a rectifier, a transmitter, or an organic light emitting diode (OLED).

Among the OEDs, an OLED has lower power consumption and a higher response speed, and is more advantageous in reducing the thickness of a display device or lighting than a conventional light source. Such an OLED also has excellent space utilization, and is expected to be applied to various fields including all types of portable devices, monitors, notebook computers and TVs.

For commercialization and expanded use of the OLED, the most critical problem is durability. Organic materials and metal electrodes included in the OLED are very easily oxidized by an external factor, for example, moisture. Therefore, a product including an OLED is very sensitive to environmental factors. For this reason, various methods have been suggested to effectively prevent the permeation of oxygen or moisture into an OED such as an OLED from the outside.

Patent Document 1 discloses an adhesive capsulation composition film and an organic electroluminescent element, where the composition is a polyisobutylene (PIB)-based pressure-sensitive adhesive and does not have high processability and has low reliability under a high-temperature and high-humidity condition.

PRIOR ART DOCUMENT

Patent Document (Patent Document 1) Korean Unexamined Patent Application Publication No. 2008-0088606

SUMMARY OF THE INVENTION

The present application provides an adhesive composition, which can form a structure effectively blocking moisture or oxygen flowing into an OED from the outside, thereby ensuring the lifespan of the OED, realize a top-emission OED and exhibit a moisture barrier property, excellent adhesive durability and reliabiltiy, and excellent reliability at high temperature and high humidity, and an OED including the same.

The present application relates to an adhesive composition. The adhesive composition may be an encapsulation material applied to encapsulate or capsulate the OED such as an OLED. In one exemplary embodiment, the adhesive composition of the present application may be applied to encapsulate or capsulate at least one of the side surfaces of an organic electronic element. Therefore, after being applied in capsulation, the adhesive composition may be present at a peripheral portion of the OED.

The term "OED" used herein refers to a product or device having a structure including an organic material layer in which electric charges are exchanged using holes and electrons between a pair of facing electrodes, and examples of the OED may include, but the present application is not limited to, a photovoltaic device, a rectifier, a transmitter, and an OLED. In an exemplary embodiment of the present application, the OED may be an OLED.

The exemplary adhesive composition for encapsulating an organic electronic element may have a viscoelastic ratio (R) in the range of 15% to 75%, 20% to 70%, 25% to 60% or 25% to 50%, which is calculated by General Equation 1:

$$R = J_i / J_{60} \times 100 \quad \text{[General Equation 1]}$$

In General Equation 1, $J_i$ is a deformation modulus measured at the time of applying an axial force to a specimen prepared from the adhesive composition. Specifically, the specimen may be prepared from the adhesive composition to have a diameter of 8 mm and a thickness of 200 μm. Also, the deformation modulus refers to a deformation modulus measured at the time of applying an axial force when the specimen is loaded in an advanced rheometric expansion system (ARES), and subjected to application of any one stress of 100 to 5000 Pa for one minute at the time of applying any one axial force of 100 to 200 g and 100° C. Also, $J_{60}$ is a deformation modulus measured one minute after the time of applying the axial force.

The term "deformation modulus" used herein refers to J(t) in $\gamma(t) = \sigma J(t)$ expressing that a strain $\gamma(t)$ measured at a time t after a stress $\gamma$ is applied is proportional to the stress $\gamma$ in a creep test for measuring deformation by applying a constant stress. In the specification, the deformation modulus may be used in the same meaning as creep compliance.

As described above, the adhesive composition may be applied to encapsulate an organic electronic element, and specifically, to encapsulate side surfaces of the organic electronic element. Conventionally, since a moisture absorbent is included in an encapsulation material, the encapsulation material had difficulty in maintaining adhesive durability and reliability due to expansion stress generated when the absorbent absorbs moisture. To reduce the expansion stress, generally, a resin with a low elastic modulus may be used. However, if the elastic modulus is low, thermal resistance is decreased, bubbles are generated in the adhesive composition, and a moisture barrier performance is decreased. Accordingly, the present application may realize adhesive durability and reliability and an excellent moisture barrier property by using an adhesive composition having the optimal range of a viscoelastic ratio as an encapsulation material to reduce the stress and realize excellent thermal resistance and moisture barrier performance.

In one exemplary embodiment, to realize the adhesive composition having the above-range of a viscoelastic ratio, components constituting the adhesive composition and contents of the components may be controlled. As long as the physical properties are satisfied, a material constituting the composition is not particularly limited. For example, in the present application, suitable ranges of viscosity and elastic modulus, a crosslinking degree between the components and a crosslinked structure may be realized in desired ranges by controlling the composition of the adhesive composition, and thus excellent adhesive durability and reliability and thermal resistance may be maintained. Meanwhile, the term "adhesive" used herein may be used in the same meaning as the adhesive composition.

The exemplary adhesive composition may include an olefin-based resin having a water vapor transmission rate (WVTR) of 50 g/m$^2$·day or less and a curable compound. The adhesive composition may include the olefin-based resin and the curable compound at 55 to 85 parts by weight and 15 to 45 parts by weight; 58 to 80 parts by weight and 18 to 43 parts by weight; or 59 to 75 parts by weight and 19 to 42 parts by weight, respectively. The present application may provide an adhesive capable of reducing expansion stress that can be generated in the encapsulation material, maintaining a cohesive strength, and realizing thermal resistance by controlling the olefin-based resin and the curable compound in the above-described weight ratios.

As described above, the adhesive composition of the present application may include the olefin-based resin having a WVTR of 50 g/m$^2$·day or less. The adhesive composition of the present application may include an olefin-based resin satisfying the above range of a WVTR, and when considering that it is applied to encapsulate or capsulate an OED, it can provide an excellent moisture barrier property. The "resin having a WVTR of 50 g/m$^2$·day or less" used herein may refer to a resin having a WVTR of 50 g/m$^2$·day or less, measured in a thickness direction of a film when the film is formed in a layer of the resin to a thickness of 100 μm. The WVTR may be 50, 40, 30, 20 or 10 g/m$^2$·day or less, measured at 100° F. and a relative humidity of 100%. As the WVTR is lower, a more excellent moisture barrier property may be exhibited. The lower limit may be, but is not particularly limited to, for example, 0 g/m$^2$·day or 0.1 g/m$^2$·day.

In detail, the exemplary olefin-based resin of the present application includes an olefin-based resin derived from a mixture of monomers, and the mixture may have an isoolefin monomer component or multiolefin monomer component having at least 4 to 7 carbon atoms. The isoolefin may be present in the range of, for example, 70 to 100 wt % or 85 to 99.5 wt % with respect to the total weight of the monomer. The multiolefin-derived component may be present in the range of 0.5 to 30 wt %, 0.5 to 15 wt % or 0.5 to 8 wt %.

The isoolefin may be, for example, isobutylene, 2-methyl-1-butene, 3-methyl-1-butene, 2-methyl-2-butene, 1-butene, 2-butene, methyl vinyl ether, indene, vinyltrimethylsilane, hexene or 4-methyl-1-pentene. The multiolefin may have 4 to 14 carbon atoms, and may be, for example, isoprene, butadiene, 2,3-dimethyl-1,3-butadiene, myrcene, 6,6-dimethyl-fulvene, hexadiene, cyclopentadiene or piperylene. Other polymerizable monomers, for example, styrene and dichlorostyrene may also be homopolymerized or copolymerized.

In the present application, the olefin-based resin may include an isobutylene-based homopolymer or copolymer. As described above, an isobutylene-based olefin-based resin or polymer may refer to an olefin-based resin or polymer including 70 mol % or more of isobutylene-derived repeat units and one or more different polymerizable units.

In the present application, the olefin-based resin may be a butyl rubber or branched butyl-like rubber. The exemplary olefin-based resin is unsaturated butyl rubber such as a copolymer of an olefin or isoolefin and a multiolefin. As the olefin-based resin included in the adhesive composition of the present application, poly(isobutylene-co-isoprene), polyisoprene, polybutadiene, polyisobutylene, poly(styrene-co-butadiene), natural rubber, butyl rubber and a mixture thereof may be used. The usable olefin-based resin in the present application may be prepared by any of the suitable means known in the art, and the present application is not limited to the method of preparing the olefin-based resin.

In one exemplary embodiment, the olefin-based resin may be a low molecular weight polyisobutylene resin. For example, the olefin-based resin may have a weight average molecular weight of 100,000 or less, and 500 or more or 55,000 or more. The present application may realize a suitable adhesive composition for coating and capsulating processes by controlling the weight average molecular weight of the olefin-based resin to be in the above range. The adhesive composition may have a liquid phase, and may be suitably applied to encapsulate side surfaces of the OED to be described below.

Also, in one exemplary embodiment, the olefin-based resin may be a resin having one or more reactive functional groups having reactivity with the above-described heat-curable resin. The reactive functional group included in the olefin-based resin may be a polar functional group. A type of the reactive functional group is not particularly limited, and may be, for example, an acid anhydride group, a carboxyl group, an epoxy group, an amino group, a hydroxyl group, an isocyanate group, an oxazoline group, an oxetane group, a cyanate group, a phenol group, a hydrazide group or an amide group. Examples of the olefin-based resin having the reactive functional group may include succinic anhydride-modified polyisobutylene, maleic anhydride-modified liquid polyisobutylene, maleic anhydride-modified liquid polyisoprene, epoxy-modified polyisoprene, hydroxyl group-modified liquid polyisoprene, and allyl-modified liquid polyisoprene. The present application may provide an adhesive having physical properties such as desired moisture barrier property, and durability and reliability in the present application by forming a crosslinked structure between the above-described olefin-based resin and a heat-curable resin which will be described below.

In an exemplary embodiment, the adhesive composition may include a curable compound. The curable compound may include a heat-curable resin or a photocurable compound. The heat-curable resin may be a resin including at least one heat-curable functional group. A specific type of the curable compound that can be used in the present application is not particularly limited, and may be, for example, various curable compounds known in the art.

In the specification, the term "heat-curable resin" refers to a resin that can be cured by suitable heating or an aging process.

In the present application, a specific type of the heat-curable resin is not particularly limited as long as the resin has the above-described properties. For example, the heat-curable resin may have an adhesive property after being cured, and may be a resin including one or more heat-curable functional groups such as an epoxy group, a glycidyl group, an isocyanate group, a hydroxyl group, a carboxyl group or an amide group. Also, a specific type of the above-described resin may be, but is not limited to, an acrylic resin, a polyester resin, an isocyanate resin or an epoxy resin, and for example, an epoxy acrylate or a urethane acrylate.

In the present application, as the heat-curable resin, an aromatic or aliphatic, or linear or branched epoxy resin may be used. In one exemplary embodiment of the present application, an epoxy resin may contain two or more functional groups and have an epoxy equivalent weight of 180 to 1,000 g/eq. Characteristics of a cured product such as an adhesive performance and a glass transition temperature may be effectively maintained by the epoxy resin having the above range of the epoxy equivalent weight. Such an epoxy resin may be one or a mixture of two or more of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenol methane-type epoxy resin, an alkyl-modified triphenol methane epoxy resin, a naphthalene-type epoxy resin, a dicyclopentadiene-type epoxy resin, and a dicyclopentadiene-modified phenol-type epoxy resin.

In the present application, as a heat-curable resin, an epoxy resin having a cyclic structure in a molecular structure may be used, and for example, an alicyclic epoxy resin may be used. Since the alicyclic epoxy resin has excellent compatibility with an olefin-based resin or a photocurable compound, it is cured without phase separation and therefore uniform crosslinks in an adhesive may be realized.

Also, the curable compound may include a photocurable compound. The photocurable compound may be a radical photocurable compound.

The photocurable compound may include a multifunctional polymerizable compound which can have compatibility with the above-described olefin-based resin, and form a specific crosslinked structure. Also, in one exemplary embodiment, the crosslinked structure may be a crosslinked structure formed by heating, a crosslinked structure formed by the irradiation of active energy rays or a crosslinked structure formed by aging at room temperature. Here, in the category of the "active energy rays", microwaves, infrared (IR) rays, UV (UV) rays, X rays, gamma rays, and particle beams including alpha-particle beams, proton beams, neutron beams and electron beams may be included, and generally, UV rays or electron beams may be used.

In an exemplary embodiment, the photocurable compound may be a multifunctional active energy ray-polymerizable compound, which may be, for example, a compound including two or more functional groups capable of participating in polymerization by the irradiation of active energy rays, for example, functional groups including an ethylene-like unsaturated double bond such as acryloyl groups, methacryloyl groups, acryloyloxy groups or methacryloyloxy groups or functional groups such as epoxy groups or oxetane groups. In one exemplary embodiment, the multifunctional active energy ray-polymerizable compound may be a bi- or higher functional compound.

In an exemplary embodiment of the present application, as the multifunctional active energy ray-polymerizable compound, for example, a multifunctional acrylate (MFA) may be used.

In an exemplary embodiment of the present application, the photocurable compound may satisfy Formula 1.

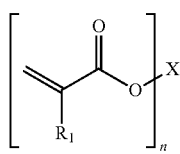

[Formula 1]

In Formula 1, $R_1$ is hydrogen or an alkyl group having 1 to 4 carbon atoms, n is an integer of 2 or higher, and X is a residue derived from a linear, branched or cyclic alkyl or alkenyl group having 3 to 30 carbon atoms. Here, when X is a residue derived from a cyclic alkyl or alkenyl group, X may be a residue derived from a cyclic alkyl or alkenyl group having 3 to 30, 4 to 28, 6 to 28, 8 to 22, or 12 to 20 carbon atoms. Also, when X is a residue derived from a linear alkyl or alkenyl group, X may be a residue derived from a linear alkyl or alkenyl group having 3 to 30, 4 to 28, 6 to 25, or 8 to 20 carbon atoms. Also, when X is a residue derived from a branched alkyl or alkenyl group, X may be a residue derived from a branched alkyl or alkenyl group having 3 to 30, 4 to 28, 5 to 25, or 6 to 20 carbon atoms.

The term "residue derived from an alkyl or alkenyl group" used herein may refer to a residue of a specific compound, for example, an alkyl or alkenyl group. In an exemplary embodiment, in Formula 1, when n is 2, X may be an alkylene or alkylidene group. Also, when n is 3 or higher, X may be an alkyl or alkenyl group from which two or more hydrogen atoms are released and then linked to a (meth)acryloyl group of Formula 1. n may be one in the range of 2 to 20.

The term "alkyl group" or "alkenyl group" used herein may be, unless particularly defined otherwise, an alkyl or alkenyl group having 1 to 30, 1 to 25, 1 to 20, 1 to 16, 1 to 12, 1 to 8, or 1 to 4 carbon atoms. The alkyl or alkenyl group may have a linear, branched or cyclic structure, and may be arbitrarily substituted by one or more substituents.

The term "alkylene group" or "alkylidene group" used herein may be, unless particularly defined otherwise, an alkylene or alkylidene group having 2 to 30, 2 to 25, 2 to 20, 2 to 16, 2 to 12, 2 to 10, or 2 to 8 carbon atoms. The alkylene or alkylidene group may have a linear, branched or cyclic structure, and may be arbitrarily substituted by one or more substituents.

The term "alkoxy group" used herein may be, unless particularly defined otherwise, an alkoxy group having 1 to 20, 1 to 16, 1 to 12, 1 to 8, or 1 to 4 carbon atoms. The alkoxy group may have a linear, branched or cyclic structure. Also, the alkoxy group may be arbitrarily substituted by one or more substituents.

In one exemplary embodiment, the multifunctional active energy ray-polymerizable compound that can be polymerized by the irradiation of active energy rays may be 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-dimethanol di(meth)acrylate, tricyclodecanedimethanol (meth)diacrylate, dimethylol dicyclopentane di(meth)acrylate, neopentylglycol-modified trimethylpropane di(meth)acrylate, adamantane di(meth)acrylate, trimethylolpropane tri(meth)acrylate, or mixtures thereof.

As curable compounds, when the heat-curable resin and the photocurable compound are used together, the photocurable compound may be included at 10 to 100 parts by weight, 10 to 90 parts by weight, 13 to 80 parts by weight, 14 to 70 parts by weight or 14 to 65 parts by weight with respect to 100 parts by weight of the olefin-based resin. Also, the heat-curable resin may be included at 10 to 50 parts by weight, 15 to 45 parts by weight, 20 to 43 parts by weight or 26 to 40 parts by weight with respect to 100 parts by weight of the olefin-based resin. As the contents of the curable compounds are controlled within the above ranges, an adhesive composition having an excellent moisture barrier property or durability and reliability may be provided. To seal the side surfaces of the organic electronic element, a process of coating the surfaces with a liquid adhesive composition is performed. However, conventionally, after coating, there is difficulty in maintaining a desired capsulated shape due to the high fluidity of the composition. When the heat-curable resin and the photocurable compound are used together as the curable compounds, the adhesive composition applied to a desired position is precured by irradiation of light to control fluidity, and then heat curing may be performed. Accordingly, the present application may maintain the applied adhesive composition to have a desired capsulated shape until main curing. That is, in the present invention, since the adhesive composition includes both of the heat-curable resin and the photocurable compound, a double curing method may be introduced, and thus the fluidity of the applied adhesive composition can be controlled at high temperature.

Also, in an exemplary embodiment of the present application, the adhesive composition may include a curing agent or an initiator. The curing agent may be a heat-curing agent or a photocuring agent. For example, a suitable type of the curing agent may be selected and used according to a type of the curable compound or functional group included in the curable compound.

In one exemplary embodiment, when the curable compound is an epoxy resin, as a curing agent for the epoxy resin known in the art, for example, one or two or more of an amine curing agent, an imidazole curing agent, a phenol curing agent, a phosphorus curing agent and an acid anhydride curing agent may be used, but the present application is not limited thereto.

In one exemplary embodiment, as the curing agent, an imidazole compound, which is in a solid phase at room temperature and has a melting point or decomposition temperature of 80° C. or more, may be used. Such a compound may be, for example, 2-methyl imidazole, 2-heptadecyl imidazole, 2-phenyl imidazole, 2-phenyl-4-methyl imidazole or 1-cyanoethyl-2-phenyl imidazole, but the present application is not limited thereto.

A content of the heat-curing agent may be selected depending on a composition of the composition, for example, a type or ratio of the heat-curable resin. For example, the heat-curing agent may be included at 1 to 20 parts by weight, 1 to 10 parts by weight or 1 to 5 parts by weight with respect to 100 parts by weight of the heat-curable resin. However, the weight ratio may be adjusted according to the type and ratio of the heat-curable resin or functional group thereof, or a crosslinking density to be realized.

In an exemplary embodiment of the present application, when both of the heat-curable resin and the photocurable compound are used as the curable compounds, the heat-curing agent may be a latent heat-curing agent such as an imidazole-isocyanuric acid addition product, an amine-epoxy addition product, a boron trifluoride-amine complex or a capsulated imidazole. That is, a radical initiator that will be described below may be a photoradical initiator, and in the present application, light irradiation may be first performed in a curing process for the adhesive composition to control initial fluidity, and the heat-curing agent, as a latent curing agent, may serve to cure the heat-curable resin when heated after the light irradiation.

In one exemplary embodiment, when the adhesive composition includes a photocurable compound as the curable compound, a radical initiator as well as the photocurable compound may be included. The radical initiator may be a photoradical initiator. A specific type of the photoinitiator may be suitable selected by considering a curing rate and yellowing probability. For example, a benzoin-based, hydroxy ketone-based, amino ketone-based or phosphine oxide-based photoinitiator may be used, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxycyclohexyl phenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone] or 2,4,6-trimethylbenzoyl-diphenyl-phosphineoxide may be used.

A content of the photoradical initiator may be changed by the type and ratio of a functional group of the radical photocurable compound, or a crosslinking density to be realized. For example, the photoradical initiator may be mixed at 0.1 to 20 parts by weight or 0.1 to 15 parts by weight with respect to 100 parts by weight of the photocurable compound. The present application may introduce a suitable crosslinked structure to the adhesive composition by controlling the content of the photoradical initiator to be in the above range, and therefore the fluidity may be controlled at high temperature.

The adhesive composition of the present application may include a moisture absorbent when needed The term "moisture absorbent" used herein may be a general term for a component capable of adsorbing or removing moisture or vapor introduced from the outside through a physical or chemical reaction. That is, the moisture absorbent may refer to a moisture reactive absorbent, a physical absorbent, or a mixture thereof.

The moisture reactive absorbent chemically reacts with vapor, moisture or oxygen flowing into the resin composition or cured product thereof to adsorb the moisture or vapor. The physical absorbent enables a migration pathway of the moisture or vapor permeating the resin composition or cured product thereof to be lengthened, and thus may inhibit the permeation of the moisture or vapor and maximize a barrier property against the moisture and vapor through a matrix structure of the resin composition or cured product thereof and an interaction with the moisture reactive absorbent.

A specific type of the moisture absorbent that can be used in the present application may be, but is not particularly limited to, for example, one or a mixture of two or more of a metal oxide, a metal salt, and phosphorus pentoxide ($P_2O_5$) as a moisture reactive absorbent, and may be zeolite, zirconia or montmorillonite as a physical absorbent.

Here, specifically, the metal oxide may be lithium oxide ($Li_2O$), sodium oxide ($Na_2O$), barium oxide (BaO), calcium oxide (CaO) or magnesium oxide (MgO), and the metal salt may be, but is not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide (CaBr$_2$), cesium bromide (CeBr$_3$), selenium bromide (SeBr$_4$), vanadium bromide (VBr$_3$), magnesium bromide (MgBr$_2$), barium iodide (BaI$_2$), or magnesium iodide (MgI$_2$); or a metal chlorate such as barium perchlorate (Ba(ClO$_4$)$_2$) or magnesium perchlorate (Mg(ClO$_4$)$_2$).

In the present application, the moisture absorbent such as the metal oxide, which has been suitably processed, may be mixed with the composition. For example, a grinding process for the moisture absorbent may be needed, and to this end, three-roll milling, bead milling or ball milling may be used.

The adhesive composition of the present application may include the moisture absorbent at 5 to 100 parts by weight, 5 to 90 parts by weight, 5 to 80 parts by weight or 10 to 50 parts by weight with respect to 100 parts by weight of the olefin-based resin. In the adhesive composition of the present application, the content of the moisture absorbent may be controlled to be 5 parts by weight or more, so that the adhesive composition or cured product thereof may exhibit an excellent moisture and vapor barrier property. Also, as the content of the moisture absorbent is controlled to be 100 parts by weight or less, when a thin film-type encapsulation structure is formed, an excellent moisture barrier property may be exhibited.

Also, in one exemplary embodiment, the adhesive composition of the present application may have a thixotropic index (TI) calculated by General Equation 1 in the range of 1.35 to 5.

$$T = V_{0.5}/V_5 \qquad \text{[General Equation 1]}$$

In General Equation 1, $V_{0.5}$ is a viscosity of the adhesive composition measured using a Brookfield viscometer with an RV-7 spindle at a temperature of 25° C. and a rotational speed of 0.5 rpm, and $V_5$ is a viscosity of the adhesive composition measured using a Brookfield viscometer with an RV-7 spindle at a temperature of 25° C. and a rotational speed of 5 rpm. Specifically, the thixotropic index (TI) may be in the range of 1.35 to 5 or 1.39 to 3.3. The term "thixotropy" used herein may refer to a property of the composition in which there is no fluidity in a stationary state, but there is fluidity when oscillated.

In the present application, as the thixotropic index (TI) of the adhesive composition is controlled as described above, an encapsulation structure having an excellent moisture barrier property may be provided via an olefin-based resin and the problem of bubbles flowing into the encapsulation material in a process of encapsulating an organic electronic element or blocking of a nozzle during coating of the composition may be prevented, and thus processability and productivity may be enhanced.

In one exemplary embodiment, the adhesive composition may have a viscosity in the range of 100,000 to 1,000,000 cPs, measured with respect to torque using a Brookfield viscometer with an RV-7 spindle at a temperature of 25° C. and a rotational speed of 0.5 rpm. Specifically, in the present application, the viscosity may be, unless particularly defined otherwise, measured using DV-II+Pro as a Brookfield viscometer with an RV-7 spindle under conditions of a temperature of 25° C. and a rotational speed of 0.5 rpm, and the viscosity range may be 100,000 to 1,000,000 cPs, 200,000 to 900,000 cPs or 300,000 to 800,000 cPs. In the present application, as the viscosity of the composition at room temperature is controlled to be 100,000 cPs or more, the precipitation of a material present in the composition, for example, a moisture absorbent or an inorganic filler, can be prevented, and a desired shape of the encapsulation structure can be formed and maintained by coating a desired position with the composition.

In one exemplary embodiment, the adhesive composition may further include an inorganic filler. The filler, other than the above-described moisture absorbent, may be included to control the thixotropic index (TI) of the adhesive composition. As described above, the thixotropic index (TI) of the adhesive composition needs to be controlled within a specific range. A method of controlling the thixotropic index (TI) within the above range is not particularly limited, but may use an adequate amount of the inorganic filler. A specific type of the filler that can be used in the present application may be, but is not particularly limited to, for example, one or a mixture of two or more of clay, talc, alumina, calcium carbonate and silica.

Also, to increase coupling efficiency between a filler and an organic binder, the present application may use a product which is subjected to surface treatment with an organic material as the filler, or further include a coupling agent.

The adhesive composition of the present application may include the inorganic filler at 0 to 50 parts by weight, 1 to 40 parts by weight, or 1 to 20 parts by weight with respect to 100 parts by weight of the olefin-based resin. The present application may provide an encapsulation structure having excellent moisture or vapor barrier property and mechanical property by controlling the content of the inorganic filler to be, preferably, 1 part by weight or more. Also, the present application may provide a cured product exhibiting an excellent moisture barrier property even when formed in a thin film by controlling the content of the inorganic filler to be 50 parts by weight or less.

Also, the inorganic filler may have a BET surface area in the range of 35 to 500 m$^2$/g, 40 to 400 m$^2$/g, 50 to 300 m$^2$/g or 60 to 200 m$^2$/g. The specific surface area is measured using a BET method, specifically, by adding 1 g of a sample of the inorganic filler into a tube and then measuring a specific surface area at −195° C. using ASAP 2020 (Micromeritics, US) without pretreatment. The same sample may be subjected to such measurement 3 times, thereby obtaining an average value. The present application may provide an encapsulation material for facilitating the realization of a desired shape of the encapsulation structure in the present application by adjusting the specific surface area of the inorganic filler within the above range.

In the adhesive composition of the present application, in addition to the above-described components, various additives may be included without affecting the above-described effects of the present application. For example, the resin composition may include a defoaming agent, a coupling agent, a tackifier, a UV stabilizer or an antioxidant at a proper range of content according to desired physical properties. In one exemplary embodiment, the adhesive composition may further include a defoaming agent. As the present application includes a defoaming agent, a defoaming property is realized in the above-described coating process of the adhesive composition, and thus a reliable encapsulation structure may be provided. Also, as long as the physical properties of the adhesive composition required in the present application are satisfied, the type of a defoaming agent is not particularly limited.

In one exemplary embodiment, the adhesive composition may be a liquid at room temperature, for example, about 25° C. In an exemplary embodiment of the present application, the adhesive composition may be a solventless-type liquid. Here, the photocurable compound may be applied as a reactive diluent in the solventless-type liquid composition.

The adhesive composition may be applied to encapsulate an organic electronic element, and specifically, to encapsulate the side surfaces of the organic electronic element. In the present application, since the adhesive composition is a liquid at room temperature, the element may be encapsulated by coating the side surfaces of the organic electronic element with the composition.

As described above, when both of the heat-curable resin and the photocurable compound are used as the curable compounds, the adhesive composition may have a viscosity of 700 to 5,000 Pa·s after light irradiation. Within the above range of viscosity, the adhesive composition may maintain a desired shape of the encapsulation structure. In one exemplary embodiment, the viscosity of the adhesive composition may be measured after the adhesive composition is irradiated with light in an UV-A wavelength range at a dose of 3 J/cm². Also, the viscosity of the adhesive composition may be the viscosity measured with respect to shear stress under conditions of a temperature of 25° C., a strain of 10% and a frequency of 1 Hz. In one exemplary embodiment, the viscosity of the composition may be 700 to 4,000 Pa·s, 800 to 3,000 Pa·s or 900 to 2,000 Pa·s.

The term "UV-A wavelength range" used herein may refer to the wavelength range of 315 to 400 nm. Specifically, in the specification, the light having the UV-A wavelength range may refer to light having any one wavelength in the range of 315 to 400 nm, or light having two or more wavelengths in the range of 315 to 400 nm.

In one exemplary embodiment of the present application, when both of the heat-curable resin and the photocurable compound are used as the curable compounds, the adhesive composition may be heated to perform main curing after the light irradiation, resulting in the formation of the encapsulation structure of an OED. The heat-curing may be performed at 40 to 100° C. To form the encapsulation structure, the adhesive composition needs physical properties such that main curing can be performed without a change in a shape of the UV-precured adhesive composition even at the high curing temperature. That is, it is necessary to prevent the phenomenon of diffusing the adhesive composition at high temperature. In one exemplary embodiment, the adhesive composition may be precured by irradiation of light in the UV-A wavelength range at a dose of 3 J/cm² as described above, and the precured resin composition may have a viscosity of 500 to 2,000 Pa·s, which is measured with respect to shear stress under conditions of a temperature of 80° C., a strain of 10% and a frequency of 1 Hz. The viscosity may be, for example, 500 to 1,800 Pa·s, 500 to 1,600 Pa·s or 600 to 1,500 Pa·s. The adhesive composition of the present application may satisfy the above range of viscosity, and therefore may be effectively applied to encapsulate the side surfaces of an OED.

The present application also relates to an OED. The exemplary OED may include, as shown in FIG. 1, a substrate 21; an organic electronic element 23 formed on the substrate 21; and a side encapsulation layer 10 formed on a peripheral portion of the substrate 21 to surround side surfaces of the organic electronic element 23, and including the above-described adhesive composition. Also, the exemplary OED may further include a entire encapsulation layer 11 covering the entire surface of the organic electronic element 23.

The entire encapsulation layer and the side encapsulation layer may be formed in the same plane. Here, the term "same" used herein may mean "substantially the same." For example, "substantially the same" in the same plane means that there may be an error of ±5 or ±1 μm in a thickness direction. The entire encapsulation layer may encapsulate the top surface of the element, or encapsulate the side surfaces of the element as well as the top surface thereof. The side encapsulation layer may be formed on the side surfaces of the element, but may not be in direct contact with the side surfaces of the organic electronic element. For example, the organic electronic element may be encapsulated such that the entire encapsulation layer may be in direct contact with the top and side surfaces of the element. That is, the side encapsulation layer may not be in contact with the element, but may be disposed on the peripheral portion of the substrate in the plan view of the OED.

The term "peripheral portion" used herein refers to an edge. That is, a peripheral portion of the substrate may refer to an edge of the substrate.

A material for constituting the side encapsulation layer may include, but is not particularly limited to, the above-described adhesive composition.

Meanwhile, the entire encapsulation layer may include an encapsulation resin, and the encapsulation resin may be an acrylic resin, an epoxy resin, a silicone resin, a fluorine resin, a styrene resin, a polyolefin resin, a thermoplastic elastomer, a polyoxyalkylene resin, a polyester resin, a polyvinyl chloride resin, a polycarbonate resin, a polyphenylenesulfide resin, a polyamide resin or a mixture thereof. A component for constituting the entire encapsulation layer may be the same as or different from the above-described adhesive composition. However, since the entire encapsulation layer is in direct contact with the element, the entire encapsulation layer may not include or may include a small amount of the above-described moisture absorbent. For example, the entire encapsulation layer may be included at 0 to 20 parts by weight with respect to 100 parts by weight of the encapsulation resin.

In one exemplary embodiment, the organic electronic element may include a reflective electrode layer formed on a substrate, an organic layer formed on the reflective electrode layer and at least including an emitting layer, and a transparent electrode layer formed on the organic layer.

In the present application, the organic electronic element 23 may be an OLED.

In one exemplary embodiment, the OED according to the present application may be, but is not limited to, a top-emission OED or a bottom-emission type OED.

The OED may further include a protective film for protecting the organic electronic element between the above-described entire encapsulation layer or side encapsulation layer and the organic electronic element.

Also, the present application relates to a method of manufacturing an OED.

In one exemplary embodiment, the manufacturing method may include applying the above-described adhesive composition to a peripheral portion of a substrate 21 on which an organic electronic element 23 is formed to surround side surfaces of the organic electronic element 23. The application of the adhesive composition may be a step for forming the above-described side encapsulation layer 10.

In detail, the formation of the side encapsulation layer may include applying the above-described adhesive composition to the organic electronic element 23 to surround the side surfaces of the organic electronic element 23, and further include performing precuring and main curing on the adhesive composition. The precuring may include light irradiation, and the main curing may include light irradiation or heating.

Here, the substrate 21 on which the organic electronic element 23 is formed may be manufactured by forming a reflective electrode or a transparent electrode on the substrate 21 such as a glass or a film by vacuum deposition or sputtering, and forming an organic material layer on the reflective electrode. The organic material layer may include a hole injection layer, a hole transport layer, an emitting layer, an electron injection layer and/or an electron transport layer. Subsequently, a second electrode may be further formed on the organic material layer. The second electrode may be a transparent electrode or a reflective electrode. Afterward, the above-described side encapsulation layer 10 is applied to the peripheral portions of the substrate 21 to cover the side surfaces of the organic electronic element 23. Here, a method of forming the side encapsulation layer 10 is not particularly limited, and may use a technique such as screen printing or dispenser coating to coat the side surfaces of the substrate 21 with the above-described adhesive composition. Also, a entire encapsulation layer 11 for encapsulating the entire surface of the organic electronic element 23 may be applied. A method of forming the entire encapsulation layer 11 may use a technique known in the art, for example, one drop filling.

Also, in the present application, a curing process may be performed on the full or side encapsulation layer for encapsulating an OED, and such a curing process (main curing) may be performed in, for example, a heating chamber or a UV chamber, and preferably performed in both chambers. Conditions for the main curing may be suitably selected according to the stability of an OED.

In one exemplary embodiment, after the coating of the above-described adhesive composition, the composition may be irradiated with light to induce crosslinking. The light irradiation may include irradiating the composition with light in the UV-A wavelength range at a dose of 0.3 to 6 J/cm$^2$ or 0.5 to 4 J/cm$^2$. As described above, a basic shape of the encapsulation structure may be realized by precuring through light irradiation.

In one exemplary embodiment, the manufacturing method may include performing main curing on the adhesive composition precured by the light irradiation. The main curing may further include heat curing at a temperature of 40 to 100° C. for 1 to 24 hours, 1 to 20 hours, 1 to 10 hours or 1 to 5 hours. Also, the main curing may include irradiation of light in the UV-A wavelength range at a dose of 0.3 to 6 J/cm$^2$ or 0.5 to 4 J/cm$^2$. The adhesive composition may be subjected to the main curing by heating or light irradiation.

Effect

The present application provides an adhesive composition which can form a structure for effectively blocking moisture or oxygen flowing into an OED from the outside, thereby ensuring the lifespan of the OED, realize a top-emission OED, and exhibit excellent adhesive durability and reliability and excellent reliability at high temperature and high humidity, and an OED including the same.

BRIEF DESCRIPTION OF THE DRAWINGS

FIG. 1 is a cross-sectional view of an OED according to an exemplary embodiment of the present application.

LIST OF REFERENCE NUMERALS

1: adhesive
10: side encapsulation layer
11: entire encapsulation layer
21: substrate
22: cover substrate
23: organic electronic element

DETAILED DESCRIPTION OF EXEMPLARY EMBODIMENTS

Hereinafter, the present application will be described in further detail with reference to examples according to the present application and comparative examples not according to the present application, and the scope of the present application is not limited to the following examples.

Example 1

As resin components, a polyisobutylene resin (PIB, Daelim, Mn=2,400 g/mol) as an olefin-based resin and an alicyclic epoxy resin (Kukdo Chemical, ST-4100D) as a curable compound were put into a mixing vessel in a weight ratio of 70:30 (PIB:ST-4100D) at room temperature. As a curing agent, 5 parts by weight of an imidazole-based curing agent (Shikoku, 2P4MHZ) was put into the vessel with respect to 100 parts by weight of the resin components. Meanwhile, as a moisture absorbent, 20 parts by weight of calcium oxide (CaO, Aldrich) was further put into the vessel with respect to 100 parts by weight of the resin components.

A homogeneous composition solution was prepared by agitating the mixing vessel using a planetary mixing device (Kurabo Industries, KK-250s).

Example 2

As resin components, a polyisobutylene resin (PIB, Daelim, Mn=2,400 g/mol) as an olefin-based resin and polybutadiene diacrylate (Sartomer, CN307) as a curable compound were put into a mixing vessel in a weight ratio of 70:30 (PIB:CN307) at room temperature. Subsequently, as a radical initiator, about 1 part by weight of 2,2-dimethoxy-1,2-diphenylethane-1-one (Irgacure 651, Ciba) was put into the vessel with respect to 100 parts by weight of the resin components. Meanwhile, as a moisture absorbent, 20 parts by weight of calcium oxide (CaO, Aldrich) was further put into the vessel with respect to 100 parts by weight of the resin components.

A homogeneous composition solution was prepared by agitating the mixing vessel using a planetary mixing device (Kurabo Industries, KK-250s).

Example 3

As resin components, a polyisobutylene resin (PIB, Daelim, Mn=2,400 g/mol) as an olefin-based resin, and an alicyclic epoxy resin (Kukdo Chemical, ST-4100D) and polybutadiene diacrylate (Sartomer, CN307) as curable compounds were put into a mixing vessel in a weight ratio of 60:20:20 (PIB:ST-4100D:CN307) at room temperature. Subsequently, as a radical initiator, about 1 part by weight of 2,2-dimethoxy-1,2-diphenylethane-1-one (Irgacure 651, Ciba) was put into the vessel with respect to 100 parts by weight of the resin components, and as a curing agent, 5 parts by weight of an imidazole-based curing agent (Shikoku, 2P4MHZ) was put into the vessel with respect to 100 parts by weight of the resin components. Meanwhile, as a moisture absorbent, 20 parts by weight of calcium oxide (CaO, Aldrich) was further put into the vessel with respect to 100 parts by weight of the resin components.

A homogeneous composition solution was prepared by agitating the mixing vessel using a planetary mixing device (Kurabo Industries, KK-250s).

Comparative Example 1

An adhesive composition was prepared by the same method as described in Example 1, except that a polyisobutylene resin (PIB, Daelim, Mn=2,400 g/mol) as an olefin-based resin and an alicyclic epoxy resin (Kukdo Chemical, ST-4100D) as a curable compound were put into a mixing vessel in a weight ratio of 90:10 (PIB:ST-4100D).

Comparative Example 2

An adhesive composition was prepared by the same method as described in Example 1, except that a polyisobutylene resin (PIB, Daelim, Mn=2,400 g/mol) as an olefin-based resin and an alicyclic epoxy resin (Kukdo Chemical, ST-4100D) as a curable compound were put into a mixing vessel in a weight ratio of 50:50 (PIB:ST-4100D).

Comparative Example 3

An adhesive composition was prepared by the same method as described in Example 2, except that a polyisobutylene resin (PIB, Daelim, Mn=2,400 g/mol) as an olefin-based resin and polybutadiene diacrylate (Sartomer, CN307) as a curable compound were put into a mixing vessel in a weight ratio of 90:10 (PIB:CN307).

Comparative Example 4

An adhesive composition was prepared by the same method as described in Example 2, except that a polyisobutylene resin (PIB, Daelim, Mn=2,400 g/mol) as an olefin-based resin and polybutadiene diacrylate (Sartomer, CN307) as a curable compound were put into a mixing vessel in a weight ratio of 40:60 (PIB:CN307).

Comparative Example 5

An adhesive composition was prepared by the same method as described in Example 3, except that a polyisobutylene resin (PIB, Daelim, Mn=2,400 g/mol) as an olefin-based resin, and an alicyclic epoxy resin (Kukdo Chemical, ST-4100D) and polybutadiene diacrylate (Sartomer, CN307) as curable compounds were put into a mixing vessel in a weight ratio of 50:20:30 (PIB:ST-4100D:CN307).

Hereinafter, physical properties in the examples and comparative examples were evaluated by the following methods.

1. Viscoelastic Ratio (R)

The adhesive composition prepared in each of the examples and the comparative examples was cured, thereby preparing a specimen having a diameter of 8 mm and a thickness of 200 μm.

The composition of each of Example 1 and Comparative Examples 1 and 2 was cured by heating in an oven at 100° C. for 3 hours, the composition of each of Example 2 and Comparative Examples 3 and 4 was cured by irradiating the adhesive composition with light in the UV-A wavelength range at a dose of 5 J/cm², and the composition of each of Example 3 and Comparative Example 5 was cured by irradiating the adhesive composition with light in the UV-A wavelength range at a dose of 5 J/cm² and heating in an oven at 100° C. for 3 hours.

The specimen was loaded in an ARES produced by TA, and subjected to measurement of $J_i$ and $J_{60}$ while a stress of 5000 Pa was applied for one minute at 100° C. at the time of applying an axial force of 200 g, and thus a viscoelastic ratio (R) was calculated by General Equation 1. Meanwhile, $J_i$ is a deformation modulus measured at the time of applying the axial force to the specimen prepared from the adhesive composition, and $J_{60}$ is a deformation modulus measured one minute after the time of applying the axial force.

$$R = J_i/J_{60} \times 100 \qquad \text{[General Equation 1]}$$

2. Compatibility

Compatibility was evaluated with respect to the adhesive compositions of the examples and the comparative examples. Phase separation was examined after the prepared adhesive composition was left in a vessel at 25° C. for 3 days. When phase separation did not occur in the composition, it was denoted as O, when partial phase separation occurred, it was denoted as Δ, and when phase separation into two layers occurred, it was denoted as X.

3. Moisture Barrier Property

To investigate a moisture barrier property of the adhesive composition of each of the examples and the comparative examples, a calcium test was performed. In detail, 7 spots of calcium (Ca) having a size of 5 mm×5 mm and a thickness of 100 nm were deposited onto a glass substrate having a size of 100 mm×100 mm, the adhesive composition of each of the examples and the comparative examples was applied at a peripheral portion (edge) at 3 mm intervals from the calcium deposited spot using a dispenser, a cover glass laminated on each calcium deposited spot and was pressed so that the adhesive composition had a width of 3 mm. Afterward, the adhesive composition of each of Example 1, and Comparative Examples 1 and 2 was cured by heating in an oven at 100° C. for 3 hours, and the adhesive composition of each of Example 2 and Comparative Examples 3 and 4 was cured by irradiation of light in the UV-A wavelength range at a dose of 5 J/cm² and heating in an oven at 100° C. for 3 hours. Afterward, the cured product was cut to obtain an encapsulated calcium (Ca) specimen having a size of 11 mm×11 mm. The obtained specimen was placed in a constant temperature and humidity chamber at 85° C. and a relative humidity of 85%, and then the time when the calcium started becoming transparent due to an oxidation reaction caused by moisture permeation was evaluated, which is shown in Table 1.

4. Reliability at High Temperature and High Humidity

The adhesive composition prepared in each of the examples and the comparative examples was applied to a 0.7 T soda lime glass, and the same type of a glass was laminated thereon. The adhesive composition prepared in each of Example 1, and Comparative Examples 1 and 2 was cured by heating in an oven at 100° C. for 3 hours, the adhesive composition prepared in each of Example 2 and Comparative Examples 3 and 4 was cured by irradiation of light in the UV-A wavelength range at a dose of 5 J/cm² and the adhesive composition prepared in each of Example 3 and Comparative Example 5 was cured by irradiation of light in the UV-A wavelength range at a dose of 5 J/cm² and heating in an oven at 100° C. for 3 hours.

Afterward, a specimen was maintained in a constant temperature and humidity chamber at 85° C. and a relative humidity of 85% for about 800 hours, and observed to determine if lifting or bubbles was generated at an interface between a glass substrate and an adhesive layer. Through observation with the naked eye, when only moisture permeation was observed without a change in an adhesion state and bubbles, it was denoted as "good," when the adhesive had a pore, bubbles or a defect, it was denoted as "bubble generation," when the interface between the substrate and the adhesive layer was lifted and had a non-adhesive part, it was denoted as "adhesion failure," and when the adhesive composition was insufficiently cured and thus the measurement failed, it was denoted as "measurement failure."

TABLE 1

| | Viscoelastic ratio (R) % | Compatibility | Moisture barrier property hrs | Adhesive reliability at high temperature and high humidity |
|---|---|---|---|---|
| Example 1 | 40 | ○ | 710 | Good |
| Example 2 | 34 | ○ | 600 | Good |
| Example 3 | 39 | ○ | 680 | Good |
| Comparative Example 1 | 13 | ○ | 420 | Bubble generation |
| Comparative Example 2 | 78 | Δ | 300 | Adhesion failure |
| Comparative Example 3 | 7 | ○ | 340 | Bubble generation |
| Comparative Example 4 | Measurement failure | X | Measurement failure | Measurement failure |
| Comparative Example 5 | Measurement failure | Δ | 450 | Adhesion failure |

What is claimed is:

1. An adhesive composition for encapsulating an organic electronic element, comprising:
   an olefin-based resin having a weight average molecular weight of 100,000 or less, and
   a curable compound,
   wherein the olefin-based resin and the curable compound are included at 55 to 85 parts by weight and 15 to 45 parts by weight, respectively, and
   wherein the adhesive composition has a viscoelastic ratio (R) of 15 to 75%, measured by General Equation 1:

$$R = J_i/J_{60} \times 100 \quad \text{[General Equation 1]}$$

where $J_i$ is a deformation modulus of a specimen of the adhesive composition, after being cured, prepared in a circular shape having a diameter of 8 mm and a thickness of 200 μm, which is loaded in an advanced rheometric expansion system (ARES), and subjected to application of any one stress of 100 to 5000 Pa for one minute at a time of applying any one axial force of 100 to 200 g and 100° C., and $J_{60}$ is a deformation modulus measured one minute after the time of applying the axial force.

2. The adhesive composition of claim 1,
   wherein the olefin-based resin has a water vapor transmission rate (WVTR) of 50 g/m²·day or less and a curable compound.

3. The adhesive composition of claim 1, wherein the olefin-based resin has one or more reactive functional groups.

4. The adhesive composition of claim 1, further comprising:
   an inorganic filler.

5. The adhesive composition of claim 1, further comprising:
   a moisture absorbent.

6. The adhesive composition of claim 5, wherein the moisture absorbent is comprised at 5 to 100 parts by weight with respect to 100 parts by weight of the olefin-based resin.

7. The adhesive composition of claim 5, wherein the moisture absorbent is one or more selected from the group consisting of $P_2O_5$, $Li_2O$, $Na_2O$, BaO, CaO, MgO, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_3$, $CuCl_2$, CsF, $TaF_5$, $NbF_5$, LiBr, $CaBr_2$, $CeBr_3$, $SeBr_4$, $VBr_3$, $MgBr_2$, $BaI_2$, $MgI_2$, $Ba(ClO_4)_2$ and $Mg(ClO_4)_2$.

8. The adhesive composition of claim 1, wherein the curable compound comprises a heat-curable resin or a photocurable compound.

9. The adhesive composition of claim 8, wherein the photocurable compound comprises a multifunctional active energy ray-polymerizable compound.

10. The adhesive composition of claim 8, further comprising:
    a curing agent or an initiator.

11. The adhesive composition of claim 8, wherein the heat-curable resin is a resin comprising one or more heat-curable functional groups.

12. The adhesive composition of claim 11, wherein the heat-curable functional group comprises an epoxy group, an isocyanate group, a hydroxyl group, a carboxyl group or an amide group.

\* \* \* \* \*